(12) United States Patent
Bettencourt et al.

(10) Patent No.: US 10,269,537 B2
(45) Date of Patent: Apr. 23, 2019

(54) VACUUM ASSEMBLY FOR AN ION IMPLANTER SYSTEM

(71) Applicant: Varian Semiconductor Equipment Associates, Inc., Gloucester, MA (US)

(72) Inventors: Robert H. Bettencourt, Gloucester, MA (US); Steven C. Borichevsky, Ipswich, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 1009 days.

(21) Appl. No.: 14/107,130

(22) Filed: Dec. 16, 2013

(65) Prior Publication Data
US 2015/0170877 A1    Jun. 18, 2015

(51) Int. Cl.
| H01J 37/317 | (2006.01) |
| F04B 37/14 | (2006.01) |
| F04D 25/16 | (2006.01) |
| H01J 37/18 | (2006.01) |

(52) U.S. Cl.
CPC .......... *H01J 37/3171* (2013.01); *F04B 37/14* (2013.01); *F04D 25/16* (2013.01); *H01J 37/18* (2013.01); *H01J 2237/1825* (2013.01)

(58) Field of Classification Search
CPC .................. H01J 37/3171; H01J 37/18; H01J 2237/1825; F04D 37/14; F04D 25/16
USPC .................. 417/49; 118/50, 50.1; 250/492.21
See application file for complete search history.

(56) References Cited

U.S. PATENT DOCUMENTS

| 6,130,436 | A  | * | 10/2000 | Renau ................. | H01J 37/3171 250/281 |
| 6,180,954 | B1 | * | 1/2001  | Verrier ................. | H01J 37/18 138/113 |
| 6,206,970 | B1 | * | 3/2001  | Atwell .................. | B03C 3/017 118/715 |
| 6,817,377 | B1 | * | 11/2004 | Reimer ................. | H01L 21/67017 118/715 |
| 6,872,956 | B2 | * | 3/2005  | Gnauck ................. | F04D 19/046 250/289 |
| 8,471,199 | B1 | * | 6/2013  | Doroshenko ......... | H01J 49/0013 250/281 |
| 2002/0158213 | A1 | * | 10/2002 | Matsunaga ........... | H01J 37/08 250/492.21 |
| 2005/0201882 | A1 | | 9/2005 | Maccarrone et al. | |
| 2006/0169206 | A1 | | 8/2006 | Evans et al. | |

(Continued)

OTHER PUBLICATIONS

International Search Report and Written Opinion dated Feb. 27, 2015 for PCT/US2014/067854 Filed Dec. 1, 2014.

*Primary Examiner* — Dominick L Plakkoottam
*Assistant Examiner* — Connor J Tremarche

(57) ABSTRACT

In one embodiment a vacuum assembly for an ion implanter system includes a first turbomolecular pump operatively coupled to a source chamber of the ion implanter system and a first backing line having a first end and a second end, the first end coupled to an exhaust port of the first turbomolecular pump, wherein the first turbomolecular pump and first end of the first backing line are configured to operate at a voltage potential of the source chamber. The vacuum assembly further includes a voltage insulator that is insulatively coupled to the first backing line, and a second turbomolecular pump operatively coupled to the first backing line, wherein the second turbomolecular pump is configured to operate at ground voltage potential.

15 Claims, 3 Drawing Sheets

(56) References Cited

U.S. PATENT DOCUMENTS

| | | | |
|---|---|---|---|
| 2006/0272775 A1* | 12/2006 | Horsky | C23C 14/48 |
| | | | 156/345.37 |
| 2009/0095713 A1* | 4/2009 | Dimeo, Jr. | C23C 14/564 |
| | | | 216/58 |
| 2010/0107980 A1 | 5/2010 | Horsky et al. | |
| 2013/0001413 A1* | 1/2013 | Witham | G01N 23/20 |
| | | | 250/251 |
| 2013/0259711 A1 | 10/2013 | Burggraf et al. | |

* cited by examiner

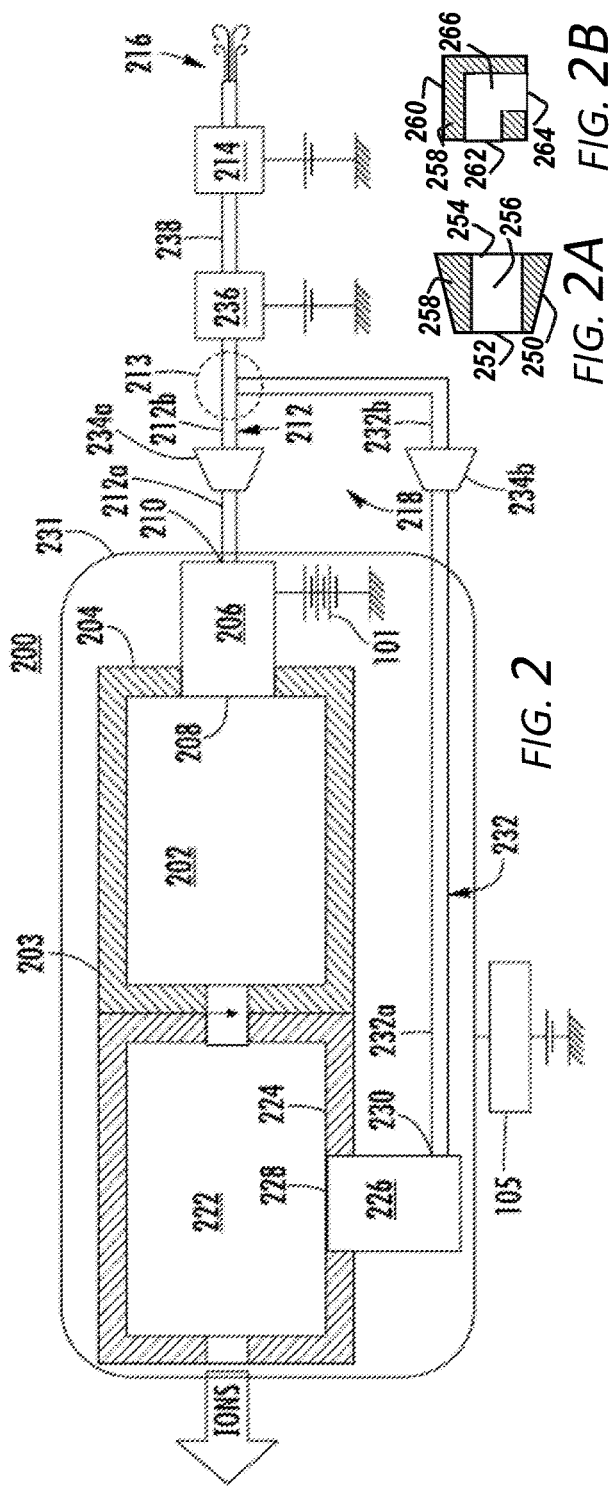
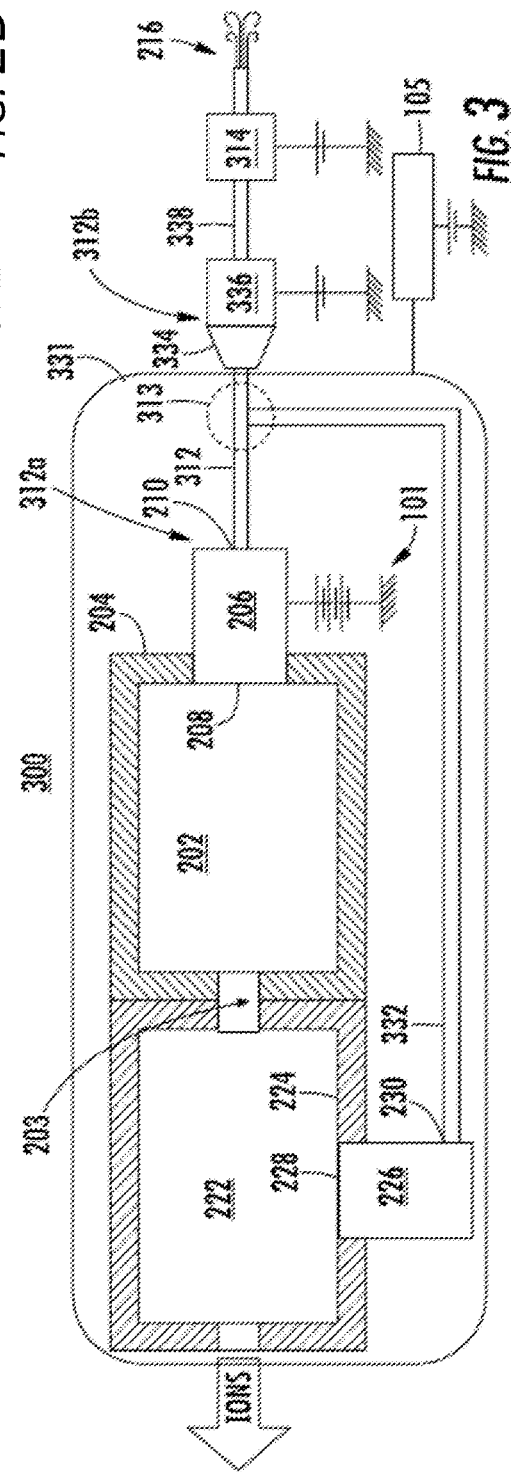

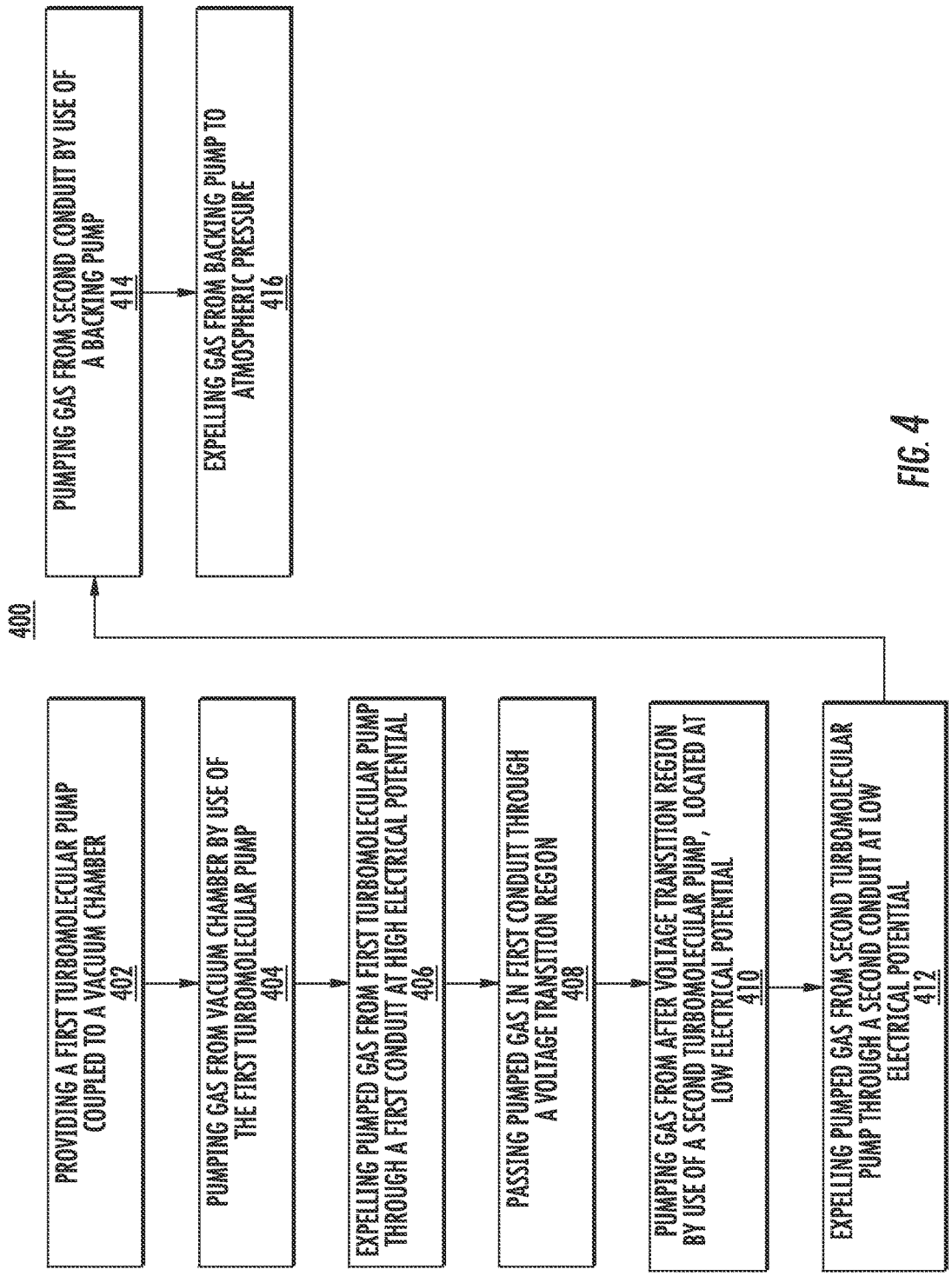

VACUUM ASSEMBLY FOR AN ION IMPLANTER SYSTEM

FIELD

Embodiments relate to the field of semiconductor device fabrication. More particularly, the present embodiments relates to an apparatus for operating a vacuum pump in high voltage apparatus.

BACKGROUND

Ion implantation is a process used to dope impurity ions into a semiconductor substrate to obtain desired device characteristics. An ion beam is directed from an ion source chamber toward a substrate. The depth of implantation into the substrate is based on the ion implant energy and the mass of the ions generated in the source chamber. One or more ion species may be implanted at different energy and dose levels to obtain desired device structures. In addition, the beam dose (the amount of ions implanted per unit area in the substrate) and the beam current (the number of ions that pass through a given plane perpendicular to the direction of the velocity vector of the beam per unit time) can be manipulated to provide a desired doping profile in the substrate.

Vacuum conditions in components of an ion implanter are often created and maintained by a turbomolecular pump. Turbomolecular pumps are a type of kinetic vacuum pump, similar to that of a turbine. A turbomolecular pump is typically designed as including a multi-stage, turbine-like rotor with bladed disks rotates in a housing. The blades of a turbine or a compressor are referred to collectively as the blading. Interposed mirror-invertedly between the rotor disks are bladed stator disks having similar geometries. Such pumps operate on the principle that gas molecules can be given momentum in a desired direction by repeated collision with a moving solid surface. In a turbomolecular pump, a rapidly spinning turbine rotor hits gas molecules, forcing the molecules from the inlet of the pump towards the exhaust in order to create or maintain a vacuum. Gas captured by the upper turbine stages is impelled into the lower turbine stages and successively compressed to a backing pump pressure level. Due to the limited compression ratio defined as the ratio of the exit pressure to the inlet pressure, turbomolecular pumps often cannot discharge against atmospheric pressure. Instead, they may require that the turbomolecular pump exhaust be connected to a backing pump which produces an exhaust pressure low enough for the turbomolecular pump to work efficiently. Typically, the backing pump pressure seen by the turbomolecular exhaust is below 500 Pa and commonly about 10 Pa.

Turbomolecular pumps are deployed, for example, within a high voltage section of ion implanter 100, and are maintained at a high voltage potential (e.g., >180 kV) with respect to electrical ground. The backing pump is conventionally maintained at the same electrical potential as the turbomolecular pump, and therefore the backing pump is also at a high voltage potential with respect to electrical ground. Backing pumps have large motors and use three phase AC, power for operation. An ion implanter that employs a turbomolecular pump in the high voltage portion of the implanter requires that the backing pump be placed at the same potential as the turbomolecular pump. It is with respect to these and other considerations that the present improvements have been needed.

SUMMARY

Exemplary embodiments of the disclosure are directed to an ion implanter having novel design for its gas evacuation apparatus, termed herein "vacuum assembly". In an exemplary embodiment, a vacuum assembly includes a voltage isolator that allows a backing pump to operate from three phase, AC power in physical and electrical isolation from one or more turbomolecular pumps in the apparatus at or near ground potential.

In one embodiment a vacuum assembly for an ion implanter system includes a first turbomolecular pump operatively coupled to a source chamber of the ion implanter system and a first backing line having a first end and a second end, the first end coupled to an exhaust port of the first turbomolecular pump, wherein the first turbomolecular pump and first end of the first backing line are configured to operate at a voltage potential of the source chamber. The vacuum assembly further includes a voltage insulator that is insulatively coupled to the first backing line, and a second turbomolecular pump operatively coupled to the first backing line, wherein the second turbomolecular pump is configured to operate at ground voltage potential.

In another embodiment, a method of maintaining vacuum in an ion implanter system includes pumping gas from the source chamber of the ion implanter system by use of a first turbomolecular pump; expelling pumped gas from the first turbomolecular pump through a first conduit at an electrical voltage potential of the source chamber; passing the pumped gas in the first conduit through a voltage transition region; and pumping gas from after the voltage transition region by use of a second turbomolecular pump, located at low electrical potential.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 2 is a block diagram of a vacuum assembly consistent with an embodiment of the disclosure;

FIG. 3 is a block diagram of a modified vacuum assembly in accordance with another embodiment of the present disclosure; and FIG. 4 is a flow chart of exemplary chamber evacuation steps utilizing a vacuum assembly in accordance with an embodiment of the present disclosure.

DESCRIPTION OF EMBODIMENTS

Figure 1:
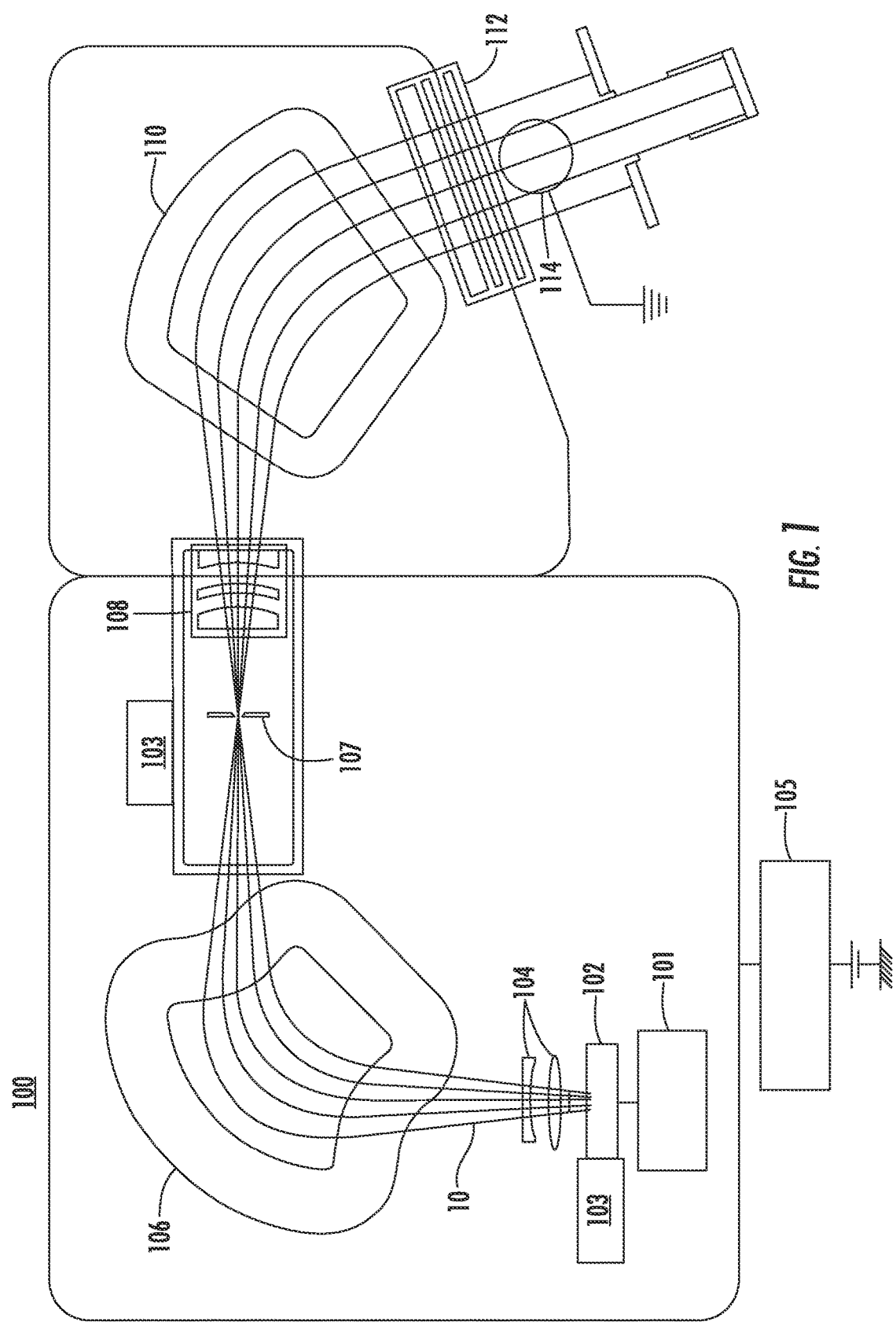
FIG. 1 is a block diagram of an exemplary ion implant tool in accordance with an embodiment of the present disclosure.

The present embodiments will now be described more fully hereinafter with reference to the accompanying drawings, in which some embodiments are shown. The present subject matter, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

FIG. 1 is a block diagram of an ion implanter 100 including an ion source chamber 102, in accordance with the present embodiments. An extraction voltage supply 101 is used to extract ions of a particular species from the ion source chamber 102 and acceleration voltage supply 105 is configured to generate ions of desired bias. Ion source chamber 102 is coupled to vacuum assembly 103, which is configured to evacuate gasses from ion source chamber 102. Vacuum assembly 103 may include high-voltage and low-voltage components as described herein below. In various embodiments, the vacuum assembly 103 includes multiple turbomolecular pumps whose function is detailed below. The multiple turbomolecular pumps may be coupled to different sections or components of the ion implanter 100, as shown in FIG. 1 by the two different positions within the ion implanter 100 of portions of the pumping system. The generated ions are extracted from the source through a series of electrodes that form an extraction electrode assembly 104 and are formed into a beam 10 which passes through a mass analyzer magnet 106. The mass analyzer magnet 106 is configured with a particular magnetic field such that only the ions with the desired mass-to-charge ratio and energy are able to travel through the analyzer for maximum transmission through the mass resolving slit 107. Ions of the desired species with the desired energy pass from mass slit 107 through deceleration stage 108 to corrector magnet 110. Corrector magnet 110 is energized to deflect ion beamlets in accordance with the strength and direction of the applied magnetic field to provide a ribbon beam targeted toward a work piece or substrate positioned on support (e.g. platen) 114. In some embodiments, a second deceleration stage 112 may be disposed between corrector magnet 110 and support 114. The ions lose energy when they collide with electrons and nuclei in the substrate and come to rest at a desired depth within the substrate based on the acceleration energy. Proper operation of ion implanter 100 requires vacuum conditions within ion implanter 100.

Different feed gases are supplied to the source chamber to generate ions having particular dopant characteristics. The ions are extracted from ion source chamber 102 via a standard extraction electrode assembly 104 to form ion beam 10. Beam 10 passes through a mass analyzer magnet 106 having a magnet which functions to pass only ions having the desired charge-to-mass ratio and kinetic energy to a resolving aperture. In particular, analyzer magnet includes a curved path where beam 10 is exposed to the applied magnetic field which causes ions having the undesired charge-to-mass ratio or kinetic energy to be deflected away from the beam path. Deceleration stage 108 includes a plurality of electrodes which outputs a diverging ion beam. A corrector magnet 110 is positioned downstream of deceleration stage 108 and is configured to deflect the ion beam 10 into a ribbon beam having parallel trajectories. The beam is targeted toward a work piece which is attached to a support 114. An additional deceleration stage 112 may also be utilized which is disposed between corrector magnet 110 and support 114. Typically, the ion source chamber 102 is at a relatively low vacuum and the remaining components of ion implanter 100 are at a relatively higher vacuum level.

FIG. 2 is a block diagram of a vacuum pumping apparatus 200 for a section of ion implanter 100 according to various embodiments. Illustrated are ion source chamber 202 coupled to resolving chamber 222. It is to be noted that the components are not necessarily drawn to scale and other components of the ion implanter 100 are omitted for clarity. In particular, resolving chamber 222 is further coupled to mass analyzer magnet 106 (not illustrated in FIG. 2) to which ions flow during operation. The mass analyzer magnet 106 is located at a position 203 intermediate the ion source chamber 202 and resolving chamber 222. Ion source chamber 202 includes a wall 204 thereof, which is maintained at a relatively high voltage with respect to electrical ground. Wall 204 has mounted onto it a turbomolecular pump 206 having an inlet side 208 facing the interior of ion source chamber 202. Exit port 210 of turbomolecular pump 206 leads through backing lines 212a, 212b (collectively, backing line 212) to turbomolecular pump 236.

In some embodiments, resolving chamber 222 further includes a wall 224 thereof, which is maintained at a relatively high voltage with respect to electrical ground. Wall 224 has mounted onto it a turbomolecular pump 226 having an inlet side 228 facing the interior of resolving chamber 222. Exit port 230 of turbomolecular pump 226 is coupled to backing lines 232a, 232b (collectively, backing line 232), which in turn is coupled to backing line 212b at coupling point 213. Backing line 232 is a conduit configured to support a flow of gas under a pressure that is less than atmospheric pressure. Turbomolecular pump 236 evacuates backing lines 212a, 212b, 232a, 232b in order to maintain a high vacuum in those lines.

Backing line 212 and backing line 232 are conduits configured to support a flow of gas under a pressure that is less than atmospheric pressure. A backing pump 214 is coupled to turbomolecular pump 236 over backing line 238. Backing pump 214, which reduces the back pressure seen by turbomolecular pump 236, is a non-turbomolecular design. The exhaust 216 of backing pump 214 exits at atmospheric pressure.

In contrast to the embodiment of FIG. 2, and by way of background, in conventional ion implanters turbomolecular pumps as well as backing pumps are maintained at a relatively high voltage with respect to electrical ground. Although turbomolecular pumps may be powered by single phase electrical power, the backing pumps are maintained at a high voltage in which the backing pumps are driven by respective motors that are powered by three-phase AC power. Depending upon design, the high electrical potential may be understood to be in the range from approximately 20 kV (mid-power) to approximately 1000 kV (high power). Relatively bulky motor-generators or expensive isolation transformers are needed to supply the three-phase AC power to the vacuum pumps in the high electrical potential region. In addition to being relatively large, the motors are prone to cause a relatively high level of vibration. Vibration is undesirable since, without adequate mitigation, the vibration may affect the alignment or accuracy with which the ion implanter operates. Supplying the three-phase AC power to the high voltage region introduces extra system capital cost and operating cost.

The embodiment illustrated in FIG. 2 addresses these issues by electrically isolating a backing pump used to evacuate the turbomolecular pumps from those turbomolecular pumps. Embodiments in accordance with the present disclosure facilitate removal of the backing pumps from regions or enclosures that include the turbomolecular pumps, and thereby eliminate the need to introduce three-phase AC power into the high voltage region of the ion implanter. As shown in FIG. 2, components within a high voltage region 231 may be placed at a high potential using the acceleration voltage supply 105.

In particular, the turbomolecular pumps 206, 226, the ion source chamber 202, resolving chamber 222 and at least a portion of respective backing lines 212, 232 may be placed at high voltage while maintaining electrical isolation from other components of the ion implanter 100, as detailed below. For example, the backing pump(s) such as backing pump 214 may be maintained at an electrical potential that is at electrical ground or within a relatively small voltage of electrical ground. In particular embodiments, backing pump 214 is at a low electrical potential 318 with respect to electrical ground, compared to the high-voltage potential of turbomolecular pumps 206, 226. The term "low electrical potential" as used herein refers to voltages less than 500 V with respect to ground.

In the example of FIG. 2, as well as in other embodiments, components of an ion implanter that are electrically coupled to high voltage may be part of an enclosure that physically and electrically isolates components therein. Thus, the high voltage region 231 pictured in FIG. 2 may constitute a physical enclosure in some embodiments. However, in other embodiment, a set of ion implanter components, such as turbomolecular pumps 206, 226, the ion source chamber 202, resolving chamber 222 and backing lines 212, 232 may be placed at a high voltage without isolation within a common enclosure.

As illustrated further in FIG. 2, electrical isolation of backing line 212 is provided by high-voltage insulator 234a that electrically isolates backing line 212a from backing line 212b. Similarly, electrical isolation of backing line 232 is provided by high-voltage insulator 234b that electrically isolates backing line 232a from backing line 232b. High-voltage insulators 234a, 234b may be located prior to coupling point 213 in the embodiment of FIG. 2. Locating high-voltage insulators 234a, 234b relatively close to their respective turbomolecular pumps 206, 226 may be advantageous for maintenance or safety reasons since the high-electrical potential portions of backing lines 212, 232 (i.e., lines backing 212a, 232a, respectively) will be relatively short compared to the low electrical potential portions of backing lines 212, 232 (i.e., backing lines 212b, 232b, respectively). Accordingly, the relative placement of high-voltage insulators 234a, 234b as depicted in FIG. 2 is not meant to indicate relative length of a high voltage portion of the respective backing lines 212a, 232a.

It is to be noted that the placement of the turbomolecular backing pump 214 at or near ground potential, without further design modifications, would render the backing lines, such as backing lines 212, 232, susceptible to Paschen glow discharge. Paschen glow discharge is known as an electrical discharge between two electrically charged surfaces, which occurs at gas-dependent combinations of gas pressure and distance between the charged surfaces as described by Paschen's law. Paschen's law describes the breakdown voltage as a function of the charged surface spacing or gap (d), operating pressure (p), and gas composition. The breakdown voltage is a function of the product of the pressure p and the spacing distance d: $V_{rup} = f(p \times d)$. The Paschen discharge may cause unwanted etching or pitting inside backing lines 212, 232, resulting in liberation of particles and/or weakening of backing lines 212, 232. Charge transport (electrical current) caused by such discharge phenomena may cause damage to the acceleration voltage supply 105. Pressure fluctuations, electromagnetic emissions and momentary short circuits may also result from Paschen discharge. Paschen discharges may cause a serious safety hazard to personnel.

In order to prevent Paschen discharge, embodiments in accordance with the present disclosure operate the backing lines 212, 232, which back the respective turbomolecular pumps 206, 226, at a high vacuum level (i.e., low pressure), such that the gas pressure level at the transition from the high-voltage region to the low-voltage region is not sufficient to support break down due to the electrical fields. As illustrated in FIG. 2, the high vacuum level in backing lines 212, 232 may be provided by turbomolecular pump 236, which is also electrically isolated from turbomolecular pumps 206, 226, thereby permitting operation of the turbomolecular pump 236 at or near ground potential.

FIG. 3 is a block diagram of a vacuum pumping apparatus 300 for a section of ion implanter 100, in accordance with another embodiment of the present disclosure. Compared to vacuum pumping apparatus 200 of FIG. 2, vacuum pumping apparatus 300 includes a single high-voltage insulator 334 that electrically isolates apparatus coupled to the entrance 312a of backing line 312 from apparatus coupled to the output 312b of backing line 312. In one embodiment, high-voltage insulator 334 may be coupled to an end of backing line 312. For example, after coupling point 313, backing line 312 may terminate at high-voltage insulator 334. As illustrated in FIG. 3, the backing line 332 is not separately provided with a high voltage insulator and is thereby configured to operate at high voltage throughout its length. In particular, all the components within the high voltage region 331, including turbomolecular pumps 206, 226, the ion source chamber 202, resolving chamber 222 and the respective backing lines 312, 332 may be placed at high voltage, while maintaining electrical isolation from other components of the ion implanter 100, as detailed below.

In another embodiment, high-voltage insulator 334 may be inserted in-line in order to electrically isolate one end of backing line 312 from an opposite end of backing line 312. Prior to high-voltage insulator 334, backing lines 312, 332 are maintained at high voltage.

High-voltage insulator 334 is then coupled to turbomolecular pump 336, either directly or through a backing line. Turbomolecular pump 336 is thereby maintained at ground or a low electrical potential with respect to earth ground, compared to the high-voltage potential of turbomolecular pumps 206, 226. Turbomolecular pump 336 evacuates backing lines 312, 332 in order to maintain a high vacuum in those lines and within high-voltage insulator 334. The output of turbomolecular pump 336 is coupled to backing line 338, which leads to backing pump 314. Backing pump 314 may be of similar design to that of backing pump 214, and may also be maintained at low electrical potential or at ground. Backing pump 314 is able to operate with its exhaust at atmospheric pressure.

In some embodiments (not illustrated in FIG. 3), turbomolecular pump 336 may be replaced with separate turbomolecular pumps added to backing lines 312 and 332, respectively, prior to coupling point 313. The high voltage insulators 234A, 234B, and 334 may be constructed from a generally hollow body substantially enclosing an interior cavity, the hollow body having two openings (i.e., apertures) to the interior cavity, and may be composed of a dielectric material such as an epoxy resin. In the configuration of FIG. 3, one opening of high-voltage insulator 334 is coupled to backing line 312 at a relatively high voltage potential, and a second opening of high-voltage insulator 334 is coupled to turbomolecular pump 336 at a relatively low voltage potential (which may be ground potential), either directly or indirectly through a backing line. In various embodiments, a high voltage insulator may accordingly include a hollow body comprising a dielectric material enclosing a cavity; a first aperture that opens to the cavity in the body, and a second aperture that opens to the cavity in the body. FIG. 2A depicts an embodiment of a high-voltage insulator 250, including a dielectric material 258 that encloses a cavity 256, where a first aperture 252 opens to the cavity 256, and a second aperture 254 that opens to the cavity 256 FIG. 2B depicts an embodiment of a high-voltage insulator 260, including a dielectric material 258 that encloses a cavity 266, where a first aperture 262 opens to the cavity 266, and a second aperture 264 that opens to the cavity 266. In this embodiment the high-voltage insulator 260 comprises an angled joint between the first aperture 262 and the second aperture 264.

High-voltage insulator 334 is sufficiently rigid in order to maintain high vacuum conditions (less than 0.001 Pa) within the body of high-voltage insulator 334. The spacing between the first opening and the second opening is at least great enough to prevent Paschen discharge within high-voltage insulator 334 at a pressure of approximately 0.01 Pa or less. High-voltage insulator 334 may be designed such that during maintenance it can be easily removed in order to clean its interior of process byproducts.

The size, shape and position of the openings of high-voltage insulator 334 may be adapted to that which they attach to. For example, high-voltage insulator 334 may be substantially tubular if both openings attach directly to lines such as backing line 312 or backing line 332. In another embodiment, high-voltage insulator 334 may be substantially conical if the first opening attaches directly to a line such as backing line 312 and the second opening attaches directly to turbomolecular pump 336. In another embodiment, high-voltage insulator 334 may provide an angled joint (e.g., a right-angle connector) if a change of direction is needed, so long as minimum spacings between high-voltage potentials and low-voltage potentials is maintained. An angled joint would provide that an axis through the first opening is not parallel to an axis through the second opening.

FIG. 4 illustrates a process 400 of maintaining process vacuum in an ion implant tool with a turbomolecular pump at high potential and a backing pump at or near ground potential. Process 400 begins at step 402, at which a vacuum chamber with an attached turbomolecular pump is provided. The turbomolecular pump is configured to evacuate gas from the vacuum chamber. Initially, the interior of the vacuum chamber is above a threshold gas pressure level, at which gas is to be pumped from the chamber.

Next, process 400 transitions to step 404 where gas is pumped from the chamber by use of a first turbomolecular pump. At step 406, the exhaust from the first turbomolecular pump (i.e., the pumped gas) is expelled from the first turbomolecular pump and into a first conduit. The first conduit, the first turbomolecular pump and the vacuum chamber are all at a relatively high voltage potential with respect to electrical ground. Next, at step 408, the expelled gas passes through a voltage transition region. For example, the act of passing may be the result of gas being forced by the first turbomolecular pump, or a result of the gas being drawn by a next element in the apparatus, or a combination of the two effects. At the entrance of the voltage transition region, the entrance is at a relatively high voltage potential with respect to ground. At the exit of the voltage transition region, the exit is at a relatively low voltage potential with respect to ground. In some embodiments, the low voltage potential is essentially at electrical ground potential.

Next, process 400 transitions to step 410, at which gas after the voltage transition region is pumped out by a second turbomolecular pump. A turbomolecular pump is used at step 410 since it is able to achieve a high vacuum condition within the voltage transition region. The second turbomolecular pump is at a relatively low voltage potential with respect to ground which may include being substantially at ground potential Next, process 400 transitions to step 412, at which the gas pumped by the second turbomolecular pump is expelled through a second conduit. The second conduit is at a relatively low voltage potential with respect to ground. Process 400 transitions to step 414, at which gas in the second conduit is pumped out by a backing pump. A backing pump is needed since the second turbomolecular pump is not able to effectively achieve a high vacuum level if expelling exhaust to atmospheric pressure. In contrast, a backing pump is able to achieve a moderate vacuum level in the second conduit while at the same time being able to expel the pumped exhaust gas to atmospheric pressure. Finally, process 400 transitions to step 416, at which the gas pumped by the backing pump is expelled to atmospheric pressure.

While the present subject matter has been disclosed with reference to certain embodiments, numers modifications, alterations and changes to the described embodiments are possible, without departing from the sphere subject matter as defined in the appended claims. Accordingly, it is intended that the subject matter of this disosure not be limited to the described embodiments, but that it has the full scope defined by the language of the following claims, and equivalents thereof.

What is claimed is:

1. A vacuum assembly for an ion implanter system, comprising: a first turbomolecular pump operatively coupled and mounted to a source chamber of the ion implanter system; a first backing line having a first end and a second end, and a first portion and a second portion, the first end coupled to an exhaust port of the first turbomolecular pump, the source chamber, first turbomolecular pump and first backing line being energized to a given potential, the given potential ranging between 20 kV and 1000 kV with respect to electrical ground potential; wherein the first turbomolecular pump and first portion of the first backing line are configured to operate at a voltage potential of the source chamber; a voltage insulator that is insulatively coupled to the first backing line, between the first portion and the second portion; and a second turbomolecular pump coupled to the second portion of the first backing line, wherein the second portion of the first backing line and the second turbomolecular pump is configured to operate at ground voltage potential, and wherein the first portion and the second portion of the first backing line are configured to operate at high vacuum; and a third turbomolecular pump operatively coupled and mounted to a resolving chamber of the ion implanter system, wherein the third turbomolecular pump is configured to operate at a voltage potential of the resolving chamber, wherein the voltage insulator further comprises an angled joint comprising a right-angle connector from an apparatus coupled to a first aperture to an apparatus coupled to a second aperture.

2. The vacuum assembly of claim 1 further comprising:
a second backing line having a first end and a second end, the first end coupled to an exhaust port of the second turbomolecular pump;
a backing pump coupled to the second end of the second backing line, wherein the backing pump is configured to operate at ground voltage potential.

3. The vacuum assembly of claim 1 further comprising:
a third backing line having a first end and a second end, the first end of the third backing line coupled to an exhaust port of the third turbomolecular pump and the second end of the third backing line coupled to the first backing line at a coupling point, wherein the first end of the third backing line is configured to operate at a voltage potential of the resolving chamber.

4. The vacuum assembly of claim 3, wherein the voltage insulator is insulatively coupled to the first backing line prior to the coupling point, the vacuum assembly further comprising a second voltage insulator insulatively coupled to the third backing line.

5. The vacuum assembly of claim 1, wherein the second turbomolecular pump is operatively coupled to the first portion of the first backing line through the voltage insulator.

6. The vacuum assembly of claim 1 wherein the voltage insulator comprises: a hollow body comprising a dielectric material enclosing a cavity; the first aperture that opens to the cavity in the body, the first aperture configured to accept the first backing line energized to a voltage of 180 kV to 1000 kV with respect to electrical ground potential; the second aperture that opens to the cavity in the body, the second aperture configured to accept an apparatus maintained within a predetermined energy level of electrical ground potential, wherein the body is configured to suppress Paschen discharge at an interior pressure of no greater than approximately 0.001 Pa.

7. The vacuum assembly of claim 1, wherein the second turbomolecular pump is configured to maintain gas pressure within the voltage insulator below a predetermined gas pressure threshold.

8. A method of maintaining vacuum in an ion implanter system, comprising: pumping gas from a source chamber of the ion implanter system by use of a first turbomolecular pump mounted to the source chamber; expelling pumped gas from the first turbomolecular pump through a first conduit at an electrical voltage potential of the source chamber, the electrical voltage potential ranging between 20 kV and 1000 kV with respect to electrical ground potential, the first conduit comprising a first portion and a second portion; passing the pumped gas in the first portion of the first conduit through a voltage transition region using a voltage insulator; providing a third turbomolecular pump operatively coupled and mounted to a resolving chamber of the ion implanter system, wherein the third turbomolecular pump is at an electrical voltage potential of the resolving chamber; and pumping gas from after the voltage transition region through the second portion of the first conduit by use of a second turbomolecular pump, the second portion and the second turbomolecular pump being located at low electrical potential, wherein the first portion and the second portion of the first conduit are at high vacuums wherein the voltage insulator comprises an angled joint comprising a right-angle connector from an apparatus coupled to a first aperture to an apparatus coupled to a second aperture.

9. The method of claim 8 further comprising:
expelling pumped gas from the second turbomolecular pump through a second conduit at low electrical potential;
pumping gas from the second conduit by use of a backing pump; and
expelling gas from the backing pump to atmospheric pressure.

10. The method of claim 9, wherein the backing pump is configured to operate at ground potential.

11. The method of claim 8 further comprising:
pumping gas from the resolving chamber by use of the third turbomolecular pump; and
expelling pumped gas from the third turbomolecular pump through a third conduit at an electrical voltage potential of the resolving chamber and into the first conduit.

12. The method of claim 8, wherein the voltage insulator is insulatively coupled to the first conduit, and wherein the second turbomolecular pump is operatively coupled to the first portion of the first conduit through the voltage insulator.

13. The method of claim 8 wherein the voltage insulator comprises: a hollow body comprising a dielectric material enclosing a cavity; the first aperture that opens to the cavity in the body, the first aperture configured to accept the first conduit energized to a voltage of 180 kV to 1000 kV with respect to electrical ground potential; the second aperture that opens to the cavity in the body, the second aperture configured to accept an apparatus maintained within a predetermined energy level of electrical ground potential, wherein the body is configured to suppress Paschen discharge at an interior pressure of no greater than approximately 0.001 Pa.

14. A vacuum assembly for an ion implanter system, comprising: a first turbomolecular pump operatively coupled and mounted to a source chamber of the ion implanter system; a first backing line having a first end and a second end, the first end coupled to an exhaust port of the first turbomolecular pump, the first backing line being energized to at least 20 kV and no more than 1000 kV with respect to electrical ground potential; wherein the first turbomolecular pump and first end of the first backing line are configured to operate at a voltage potential of the source chamber; a voltage insulator that is insulatively coupled to the first backing line; and a second turbomolecular pump coupled to the first backing line, wherein the second turbomolecular pump is configured to operate at ground voltage potential; and a third turbomolecular pump operatively coupled and mounted to a resolving chamber of the ion implanter system, wherein the third turbomolecular pump is configured to operate at a voltage potential of the resolving chamber, wherein the voltage insulator comprises an angled joint comprising a right-angle connector from an apparatus coupled to a first aperture to an apparatus coupled to a second aperture.

15. A method of maintaining vacuum in an ion implanter system, comprising: pumping gas from a source chamber of the ion implanter system by use of a first turbomolecular pump mounted to the source chamber; expelling pumped gas from the first turbomolecular pump through a first conduit at an electrical voltage potential of the source chamber, the electrical voltage potential being at least 20 kV and no more than 1000 kV with respect to electrical ground potential; passing the pumped gas in the first conduit through a voltage transition region using a voltage insulator; providing a third turbomolecular pump operatively coupled and mounted to a resolving chamber of the ion implanter system, wherein the third turbomolecular pump is at an electrical voltage potential of the resolving chamber; and pumping gas from after the voltage transition region by use of a second turbomolecular pump, located at low electrical potential, wherein the voltage insulator comprises an angled joint comprising a right-angle connector from an apparatus coupled to a first aperture to an apparatus coupled to a second aperture.

* * * * *